(12) United States Patent
Tokashiki (10) Patent No.: US 10,811,267 B2
(45) Date of Patent: Oct. 20, 2020

(54) METHODS OF PROCESSING SEMICONDUCTOR DEVICE STRUCTURES AND RELATED SYSTEMS

(71) Applicant: Micron Technology, Inc., Boise, ID (US)

(72) Inventor: Ken Tokashiki, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 256 days.

(21) Appl. No.: 15/851,178

(22) Filed: Dec. 21, 2017

(65) Prior Publication Data

US 2019/0198333 A1 Jun. 27, 2019

(51) Int. Cl.
*H01L 21/3065* (2006.01)
*H01J 37/32* (2006.01)
(Continued)

(52) U.S. Cl.
CPC .... *H01L 21/3065* (2013.01); *H01J 37/32091* (2013.01); *H01J 37/32165* (2013.01);
(Continued)

(58) Field of Classification Search
CPC ............. H01L 21/3086; H01L 21/6831; H01L 21/67109; H01L 21/3081; H01L 21/3065;
(Continued)

(56) References Cited

U.S. PATENT DOCUMENTS 9,337,056 B2 5/2016 Takahashi et al.
9,640,409 B1 5/2017 Yang et al.
(Continued)

FOREIGN PATENT DOCUMENTS

KR 10-2014-0060502 A 5/2014
WO 2015/179192 A1 11/2015

OTHER PUBLICATIONS

Aachmoun et al., Deep Anisotropic Etching of Silicon, Journal of Vacuum Science & Technology A: Vacuum, Surfaces, and Films, vol. 17, , No. 4 (1998/1999), pp. 2270-2273.
(Continued)

*Primary Examiner* — Kevin J Comber
(74) *Attorney, Agent, or Firm* — TraskBritt (57) ABSTRACT

Methods of processing a semiconductor device structure comprise cooling an electrostatic chuck (ESC) for the semiconductor device structure, which comprises tiers of alternating materials including at least one dielectric material, to a temperature of −30° C. or less, forming an opening in the semiconductor device structure with a plasma of a gas comprising a hydrogen-based gas and a fluorine-based gas in which the hydrogen-based gas comprises between about 10 vol % and 90 vol %. Other methods of processing a semiconductor device structure comprise cooling an ESC for the semiconductor device structure to a temperature of −30° C. or less, applying a low frequency radio frequency (RF) having a non-sinusoidal waveform to the ESC, and forming an opening in the semiconductor device structure with a generated plasma. A processing system includes an ESC, a coolant system, and a low frequency RF power source generating a non-sinusoidal waveform comprising a combination of multiple sinusoidal waveforms.

24 Claims, 7 Drawing Sheets

(51) Int. Cl.

| | |
|---|---|
| *H01L 21/308* | (2006.01) |
| *H01L 21/311* | (2006.01) |
| *H01L 21/683* | (2006.01) |
| *H01L 21/02* | (2006.01) |
| *H01L 21/3213* | (2006.01) |
| *H01L 21/67* | (2006.01) |
| *H01L 27/11582* | (2017.01) |

(52) U.S. Cl.
CPC .. *H01J 37/32724* (2013.01); *H01L 21/02164* (2013.01); *H01L 21/3081* (2013.01); *H01L 21/3085* (2013.01); *H01L 21/3086* (2013.01); *H01L 21/31116* (2013.01); *H01L 21/31144* (2013.01); *H01L 21/32137* (2013.01); *H01L 21/67109* (2013.01); *H01L 21/6831* (2013.01); *H01L 27/11582* (2013.01)

(58) Field of Classification Search
CPC ........... H01L 21/32137; H01L 21/3085; H01L 21/31144; H01L 21/02164; H01L 21/31116; H01L 27/11582; H01J 37/32091; H01J 37/32165; H01J 37/32724
USPC ........................................................ 361/235
See application file for complete search history.

(56) References Cited

U.S. PATENT DOCUMENTS

| | | | |
|---|---|---|---|
| 9,659,789 B2 | 5/2017 | Takeda et al. | |
| 9,666,446 B2 | 5/2017 | Tominaga et al. | |
| 2002/0072016 A1 | 6/2002 | Chen et al. | |
| 2009/0315596 A1 | 12/2009 | Leming et al. | |
| 2012/0052599 A1* | 3/2012 | Brouk ................... C23C 14/345 |
| | | | 438/5 |
| 2013/0109190 A1 | 5/2013 | Lill et al. | |
| 2015/0235862 A1* | 8/2015 | Takahashi ......... H01L 21/31116 |
| | | | 438/714 |
| 2016/0064194 A1 | 3/2016 | Tokashiki et al. | |
| 2016/0064519 A1 | 3/2016 | Yang et al. | |
| 2016/0314986 A1 | 10/2016 | Tominaga et al. | |
| 2016/0379856 A1 | 12/2016 | Tomura et al. | |
| 2017/0162399 A1 | 6/2017 | Takayama et al. | |
| 2017/0178921 A1 | 6/2017 | Takeda et al. | |
| 2017/0178922 A1 | 6/2017 | Takashima et al. | |
| 2018/0286707 A1* | 10/2018 | Hudson ............. H01L 21/31116 |
| 2019/0131135 A1* | 5/2019 | Belau ................. H01L 21/3065 |

OTHER PUBLICATIONS

Agarwal et al., Effect of Nonsinusoidal Bias Waveforms on Ion Energy Distributions and Fluorocarbon Plasma Etch Selectivity, J. Vac. Sci. Technol. vol. A 23, vol. 5, (Sep./Oct. 2005), pp. 1440-1449.

Mellhaoui et al., SiOxFy Passivation Layer in Silicon Cryoetching, Journal of Applied Physics, vol. 98, (2005), pp. 104901-1-104901-10.

Parasuraman et al., Deep Reactive Ion Etching of Sub-Micrometer Trenches with Ultra High Aspect Ration, Microelectronic Engineering, vol. 113, (2014), pp. 35-39.

Tachi et al., Low-Temperature Reactive Ion Etching and Microwave Plasma Etching of Silicon, Appl. PHys. Lett., vol. 52, (1988), pp. 616-618.

International Application No. PCT/US2018/065693, dated Apr. 11, 2019, 4 pages.

International Written Opinion from International Application No. PCT/US2018/065693, dated Apr. 11, 2019, 6 pages.

* cited by examiner

METHODS OF PROCESSING SEMICONDUCTOR DEVICE STRUCTURES AND RELATED SYSTEMS

TECHNICAL FIELD

The disclosure, in various embodiments, relates generally to the field of semiconductor device fabrication. More specifically, the disclosure relates to methods of etching semiconductor device structures and to related etching systems.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and Flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for Flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND Flash memory device is a common type of Flash memory device, so called for the logical form in which the basic memory cell configuration is arranged. Typically, the array of memory cells for NAND Flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A so-called "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes semiconductor pillars extending through openings in tiers of conductive structures (e.g., word line plates, control gate plates) and dielectric materials at each junction of the semiconductor pillars and the conductive structures. Such a configuration permits a greater number of transistors to be located in a unit of die area by building the array upwards (e.g., longitudinally, vertically) on a die, as compared to structures with conventional planar (e.g., two-dimensional) arrangements of transistors.

Increasing memory density may be achieved by increasing an aspect ratio (i.e., depth to width ratio) of openings formed in tiers of conductive and dielectric materials. However, as the aspect ratio of the openings increases, etch rates for forming the openings using conventional reactive ion etch technologies decreases significantly. This phenomenon prevents the openings from reaching their intended depths and prevents the openings from being formed within an acceptable period of time, requiring additional process steps. In addition, as the etch rate decreases, the rate at which the plasma etches the sidewalls of the openings increases. Etching of the sidewalls of the openings results in the undesirable formation of bowed sidewalls, which is a phenomena commonly referred to as "bowing," and results in openings having inconsistent diameters.

DETAILED DESCRIPTION

The illustrations included herewith are not meant to be actual views of any particular systems or semiconductor device structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an etch tool for fabricating semiconductor devices or a complete description of a process flow for manufacturing such semiconductor devices. The structures described below do not form complete semiconductor device structures. Only those process acts and structures necessary to understand the embodiments described herein are described in detail below. Additional acts to form a complete system for an etch tool or a semiconductor device described herein may be performed by conventional techniques.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" used in reference to a given parameter is inclusive of the stated value and has the meaning dictated by the context (e.g., it includes the degree of error associated with measurement of the given parameter).

As used herein, any relational term, such as "first," "second," "over," "under," "on," "underlying," "overlying," etc., is used for clarity and convenience in understanding the disclosure and drawings and does not connote or depend on any specific preference, orientation, or order.

Methods of processing a semiconductor device structure according to embodiments of the present disclosure facilitate the removal of one or more materials of tiers of alternating material of a semiconductor device structure by increasing an etch rate thereof. By increasing the etch rate of these materials, bowing of openings formed in the semiconductor device structure is decreased and depths to which the openings are formed are increased, which results in the formation of openings having a high aspect ratio (HAR), such as a HAR of at least about 50:1 or at least about 100:1.

In at least some embodiments, a method of processing a semiconductor device structure includes generating a plasma of a gas comprising a hydrogen-based gas and a fluorine-based gas. The hydrogen-based gas comprises between about 10 percent by volume (vol %) and 90 vol % of the gas. The method further includes cooling an electrostatic chuck on which the semiconductor device structure is positioned to a temperature of about −30° C. or less, the semiconductor device structure comprising tiers of alternating materials including at least one dielectric material, and forming an opening in the semiconductor device structure with the plasma.

Methods of processing a semiconductor device structure according to additional embodiments of the present disclosure include generating a plasma of a gas, cooling an electrostatic chuck on which a semiconductor device structure is positioned to a temperature of about −30° C. or less, the semiconductor device structure comprising tiers of alternating material including at least one dielectric material, applying a low frequency radio frequency having a non-sinusoidal waveform to the electrostatic chuck, and forming an opening in the semiconductor device structure with the plasma.

Figure 1:
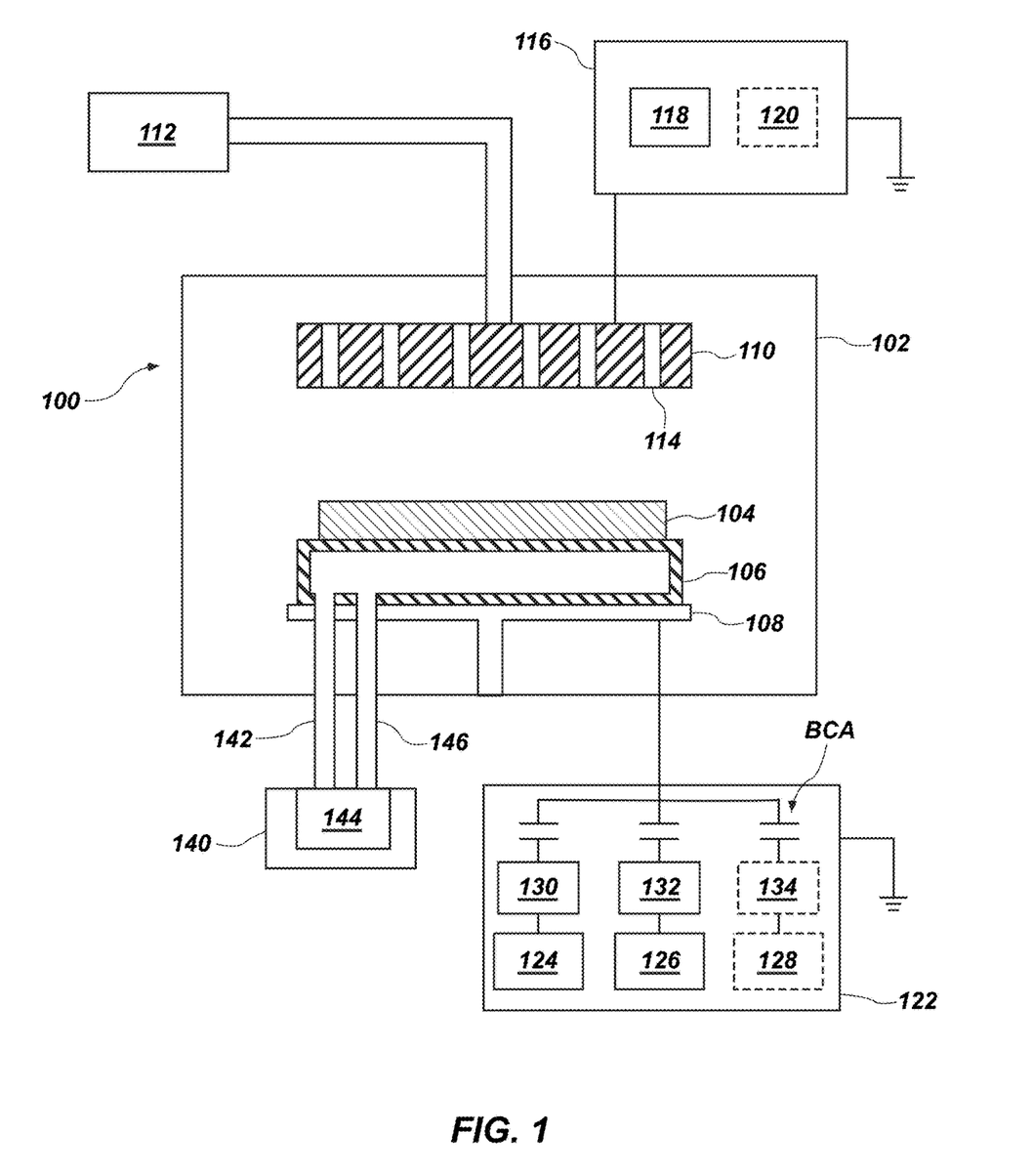
FIG. 1 is a simplified schematic of an etching system for fabricating a semiconductor device according to embodiments of the present disclosure.

FIG. 1 is a schematic illustration of an etching system 100, which may also be characterized as an "etch tool," for performing a removal (e.g., patterning, etching) process according to embodiments of the present disclosure. The etching system 100 includes a capacitively coupled plasma etching device having more than one radio frequency RF power source. The etching system 100 includes an etching chamber 102 in which a semiconductor device structure 104 may be positioned on a support structure, such as an electrostatic chuck 106 over a pedestal 108. The etching system 100 further includes a gas distribution showerhead 110 for distributing one or more gases from a gas supply source 112 through apertures 114 therein and into the etching chamber 102.

A first power supply 116 may be electrically coupled to the gas distribution showerhead 110, which may comprise an upper electrode of the etching system 100. In other embodiments, an upper electrode may be provided that is separate from the gas distribution showerhead 110. In yet other embodiments, the first power supply 116 may be electrically coupled to the electrostatic chuck 106. The first power supply 116 may comprise a direct current (DC) power source 118 and, optionally, a radio frequency (RF) power source 120. The RF power source 120 may comprise a high frequency RF power source. The upper electrode and the first power supply 116 may be electrically connected to an electrical ground.

A second power supply 122 may be electrically coupled to the electrostatic chuck 106, which may comprise a lower electrode of the etching system 100. In other embodiments, a lower electrode may be provided that is separate from the electrostatic chuck 106. The second power supply 122 includes at least one RF power source such as a first, low frequency RF power source 124 and, optionally, a second, low frequency RF power source 126. The second power supply 122 may also, optionally, comprise a high frequency RF power source 128 in lieu of the RF power source 120 of the first power supply 116 and vice versa. A block capacitor BCA may be provided between each of the respective RF power sources 124, 126, 128 and the electrostatic chuck 106. Each of the respective RF power sources 124, 126, 128 may further be connected to the electrostatic chuck 106 through a matching box 130, 132, 134 provided respectively between each RF power source 124, 126, 128 and the electrostatic chuck 106. The matching boxes 130, 132, 134 are configured to cause the load impendence of the RF power sources 124, 126, 128 to match the internal (or output) impendence thereof when plasma is generated in the etching chamber 102. The second power supply 122 and the electrostatic chuck 106 may be electrically connected to an electrical ground.

A coolant system 140 is connected to the electrostatic chuck 106. The coolant system 140 includes a coolant channel 142 extending from a coolant tank 144 through the electrostatic chuck 106 and a return channel 146 extending from the electrostatic chuck 106 to the coolant tank 144. A cooling medium flows through the coolant channel 142 and the return channel 146 to reduce the temperature of at least one of the semiconductor device structure 104 and the electrostatic chuck 106. In some embodiments, the cooling medium may comprise chilled water, a chilled brine solution, liquid carbon dioxide, liquid nitrogen, helium, or another material. The coolant system 140 is configured to reduce the temperature of at least one of the semiconductor device structure 104 and the electrostatic chuck 106 during the removal (e.g., patterning, etching) process to a temperature at or below about 0° C., at or below about −30° C., at or below about −50° C., or at or below about −60° C. As discussed herein, reducing the temperature of the semiconductor device structure 104 and/or the electrostatic chuck 106 during the etching process facilitates the removal of one or more materials of stacks of material of semiconductor device structures by increasing an etch rate of the material with decreasing temperature.

Figure 2:
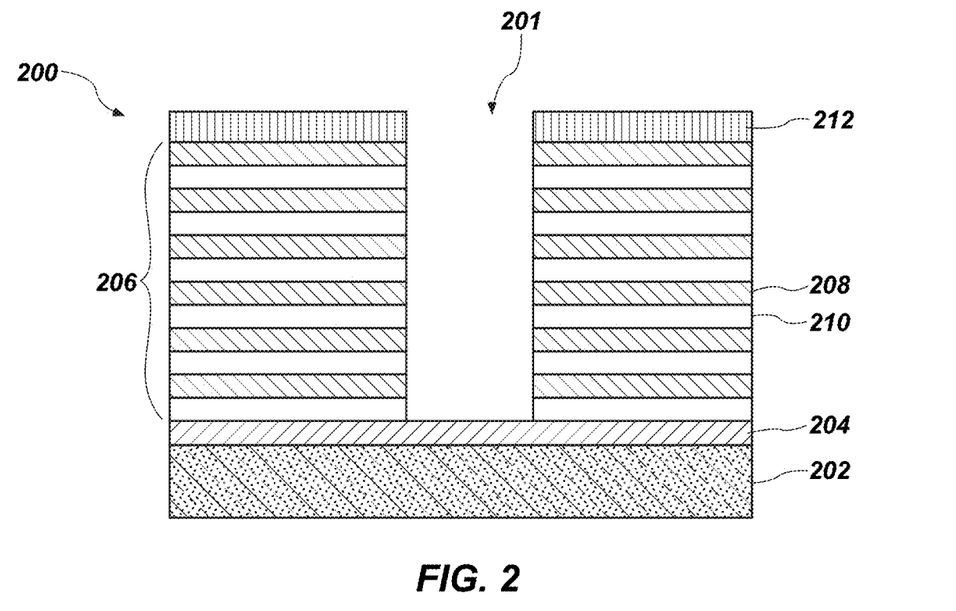
FIGS. 2 and 3 are simplified schematics of partially formed semiconductor devices that may be fabricated according to embodiments of the present disclosure.

FIG. 2 illustrates a semiconductor device structure 200 that has been at least partially formed according to embodiments of the present disclosure. More particularly, the semiconductor device structure 200 has been subjected to a removal process (e.g., an etch process) according to embodiments of the present disclosure to create an opening 201 through the stack 206 using the etching system 100. In such embodiments, the opening 201 may be formed to have a high aspect ratio (HAR), such as a HAR of at least about 50:1 or at least about 100:1. Although the semiconductive device structure 200 of FIG. 2 shows only one opening 201, it is understood that the semiconductor device structure 200 may include more than one opening. The semiconductor device structure 200 may comprise a structure that may form a 3D NAND Flash memory device using a "replacement gate" process, as known in the art. In such embodiments, the semiconductive device structure 200 may comprise a substrate 202, optionally, an etch stop material 204, a stack 206 including tiers of alternating levels of first and second dielectric materials 208, 210 formed over the substrate 202, and a etch mask material 212 formed over the stack 206. The formation of the first and second dielectric materials 208, 210 is conducted by conventional techniques and is not described in detail herein.

The etch stop material 204 may be aluminum oxide or other conventional etch stop material selected such that the materials of the stack 206 may be selectively removed without removing other materials of the semiconductor device structure 200. Any known dielectric materials may be used for the alternating tier dielectric materials 208, 210 in the stack 206. In some embodiments, the first dielectric material 208 may comprise an oxide material, and the second dielectric material 210 may comprise a nitride material such that the stack 206 comprises an oxide-nitride-oxide (ONO) structure. In such embodiments, the oxide material of the first dielectric material 208 may include, but is not limited to, a silicon oxide ($SiO_x$), such as silicon dioxide ($SiO_2$), phosphosilicate glass, borosilicate glass, borophosphosilicate glass, fluorosilicate glass, or a combination thereof. The nitride material of the second dielectric material 210 may comprise, but is not limited to, a silicon nitride, such as silicon nitride or silicon oxynitride. In the replacement gate process, the nitride materials are subsequently replaced with a conductive material at a later stage of processing. Portions of the alternating tier dielectric materials 208, 210 are removed by exposure to the plasma, forming the HAR opening 201.

Figure 3:
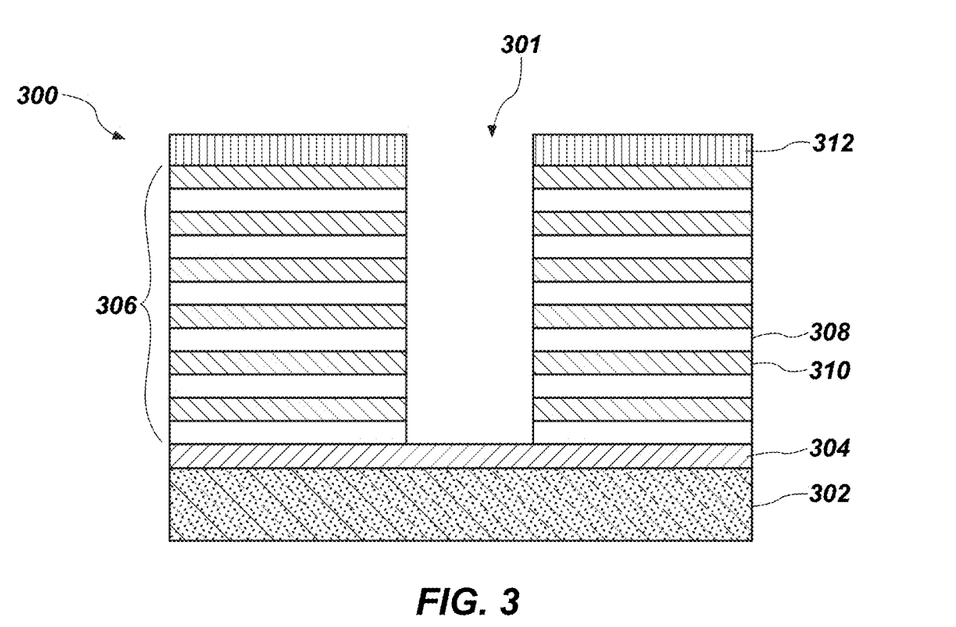

FIG. 3 illustrates a semiconductor device structure 300 that has been etched to form an opening 301 therein according to embodiments of the present disclosure. More particularly, the semiconductor device structure 300 has been subjected to a removal process according to embodiments of the present disclosure to create an opening 301 through the stack 306 using the etching system 100. In such embodiments, the opening 301 may be formed to have a HAR of at least about 50:1, such as at least about 100:1. Although the semiconductor device structure 300 of FIG. 3 shows only one opening 301, it is understood that the semiconductor device structure 300 may include more than one opening. The semiconductor device structure 300 may comprise a structure that may form a 3D NAND Flash memory device using a floating gate process as known in the art. In such embodiments, the semiconductor device structure 300 may comprise a substrate 302, optionally, an etch stop material 304, a stack 306 including tiers of alternating levels of dielectric material 308 and conductive material 310 formed over the substrate 302, and a etch mask 312 formed over the stack 306. The formation of the dielectric material 308 and the conductive material 310 is conducted by conventional techniques and is not described in detail herein.

The etch stop material 304 may comprise material similar to those of the etch stop material 204 previously described herein. The dielectric material 308 may comprise a dielectric material as previously described with regard to the alternating tier dielectric materials 208, 210 in the stack 206. In some embodiments, the dielectric material 308 may comprise an oxide material, such as a silicon oxide ($SiO_x$), including by way of non-limiting example silicon dioxide ($SiO_2$), phosphosilicate glass, borosilicate glass, borophosphosilicate glass, fluorosilicate glass, or a combination thereof. The conductive material 310 may comprise a polysilicon material. The polysilicon material may be undoped, n-doped, or p-doped polysilicon. In some embodiments, the dielectric material 308 may comprise an oxide material, and the conductive material 310 may comprise a polysilicon material such that the stack 306 comprises an oxide-polysilicon-oxide (OPO) structure. Portions of the alternating tier dielectric material 308 and conductive material 310 are removed by exposure to the plasma, forming the HAR opening 301.

Referring to FIGS. 1 through 3, in use and operation of the etching system 100, a plasma is generated of a gas supplied from the gas supply source 112 by the high frequency RF of either the RF power source 128 of the second power supply 122 or the RF power source 120 of the first power supply 116. The high frequency RF may have a frequency of up to about 60 MHz. In some embodiments, the high frequency RF may be selected to extend in a range from about 13 MHZ to about 60 MHz, inclusive, such as about 13.68 MHz, about 40 MHz, or about 60 MHz. Adjustment of the frequency of the high frequency RF may alter an ion flux of the plasma generated in the etching system 100. The low frequency of one or more of the first, low frequency RF power source 124 or the second, low frequency RF power source 126 may be less than a frequency of the high frequency RF. In some embodiments, a frequency of the first, low frequency RF power source 124 or the second, low frequency power source 126 may extend in a range between about 100 Hz and about 3.2 MHz, inclusive.

The gas supplied from the gas supply source 112 may be selected based on the material composition of the stack 206, 306 of the semiconductor device structures 200, 300. In some embodiments, the plasma may be generated from at least one of a fluorine-based gas and a hydrogen-based gas. The fluorine-based gas may include, but is not limited to, one or more of carbon tetrafluoride ($CF_4$), trifluoromethane ($CHF_3$), difluoromethane ($CH_2F_2$), fluoromethane ($CH_3F$), octafluorocyclobutane ($C_4F_8$), hexafluoro-2-butyne ($C_4F_6$), perfluorocyclopentene ($C_5F_8$), nitrogen trifluoride ($NF_3$), sulfur trifluoride ($SF_6$), trifluoroiodomethane ($CF_3I$), bromotrifluoromethane ($CF_3Br$), boron trifluoride ($BF_3$), and other halogen gases. The hydrogen-based gas may comprise hydrogen ($H_2$), hydrogen fluoride (HF), hydrogen sulfide ($H_2S$), ammonia ($NH_3$), methanol ($CH_3OH$), water ($H_2O$), and other hydrocarbons. In some embodiments, the etching gas may further include a carrier gas, such as a noble gas including, but not limited to, helium (He), neon (Ne), argon (Ar), krypton (Kr), and xenon (Xe).

Figure 4:
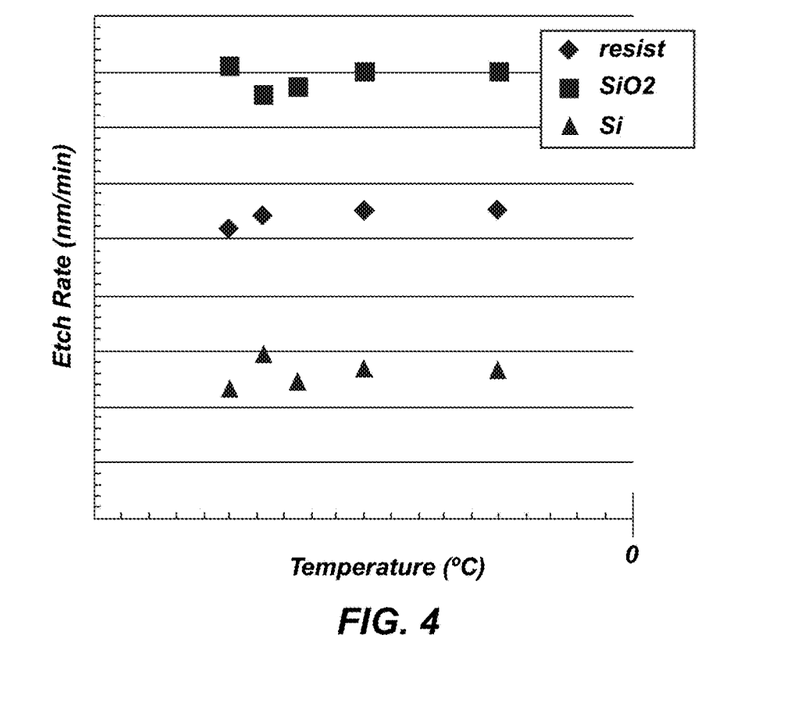
FIGS. 4 and 5 illustrate etch rates for materials of the semiconductor devices of FIGS. 2 and 3 and using a plasma gas lacking any hydrogen-based gas and using a plasma gas comprising 50 vol % hydrogen-based gas, respectively, as a function of electrostatic chuck temperature.
Figure 5:
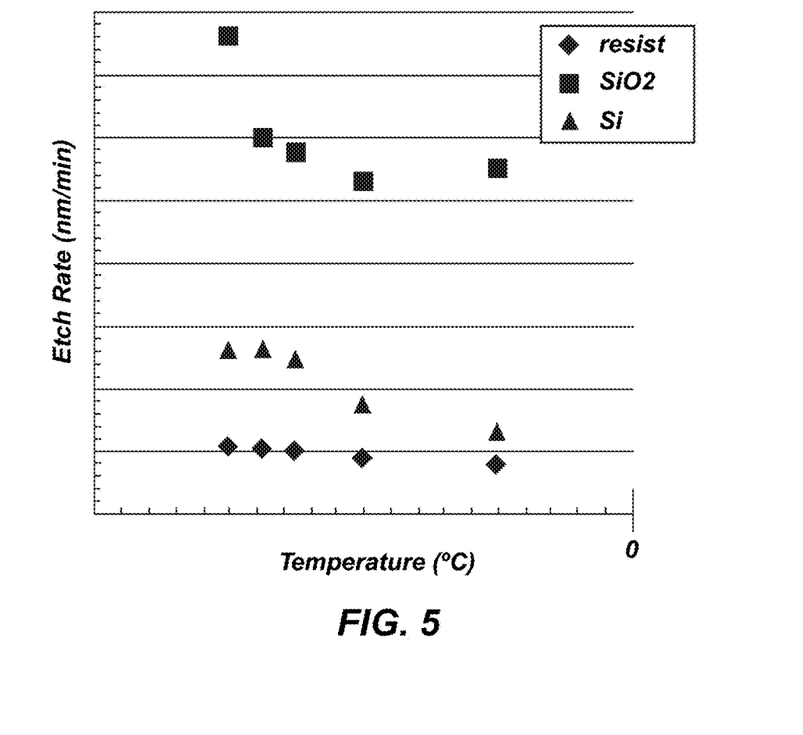

According to embodiments of the present disclosure, the concentration of the hydrogen-based gas in the gas source may be selected to comprise between about 10 vol % and 90 vol % of the plasma. In other embodiments, the concentration of the hydrogen-based gas in the plasma may be selected to extend in a range from about 40 vol % to about 75 vol %, such as about 40 vol % or about 50 vol %. As explained with reference to FIGS. 4 and 5, the inclusion of hydrogen in the plasma may facilitate the removal of one or more materials of stacks 206, 306 of material of the semiconductor device structures 200, 300 by increasing an etch rate of the material. FIGS. 4 and 5 are graphs illustrating the relationship of etch rate of the semiconductor device structure 300 as a function of temperature of the electrostatic chuck 106 provided by the coolant system 140. The semiconductor device structure 300 comprises a photoresist material as the etch mask 312, silicon dioxide as the dielectric material 308, and polysilicon as the conductive material 310. The silicon oxide and polysilicon are etched using a plasma gas lacking any hydrogen-based gas (FIG. 4) and a plasma gas comprising 50 vol % hydrogen-based gas (FIG. 5). More particularly, the plasma gas composition illustrated in FIG. 5 comprises equal parts hydrogen ($H_2$) and carbon tetrafluoride ($CF_4$). As illustrated in FIG. 4, the etch rate of any of the etch mask 312, the dielectric material 308, and the conductive material 310 remains substantially constant with decreasing temperature. As illustrated in FIG. 5, with a composition of 50 vol % hydrogen-based gas, the etch rate of the etch mask 312 remains substantially constant while the etch rate of the dielectric material 308 and the conductive material 310 increases with decreasing temperature. Accordingly, the etch rate of one or more materials of the semiconductor device structures 200, 300 may be increased by the inclusion of hydrogen in the plasma etching composition and by reducing the temperature of the electrostatic chuck 106. The resulting etch rates of the dielectric materials may be at least three times greater than etch rates of the same materials conducted at higher temperatures and using plasmas lacking the hydrogen-based gas. By increasing the etch rates, the productivity and throughput of forming the semiconductor device structures may be increased.

According to embodiments of the present disclosure, power of at least one of the first power supply 116 and the second power supply 122 may be selected to increase an etch rate of the dielectric material(s) of the semiconductor device structure 200, 300. In some embodiments, the frequency and/or shape of a waveform of the first low frequency RF power source 124 may be selected to adjust an ion energy (e.g., a bombardment energy) of the plasma toward the semiconductor device structure 200, 300. More particularly, application of the low frequency during the etching process may increase the ion energy of the plasma ions and, as a result, an etch rate of one or more materials of the semiconductor device structures 200, 300 may be increased.

Figure 6:
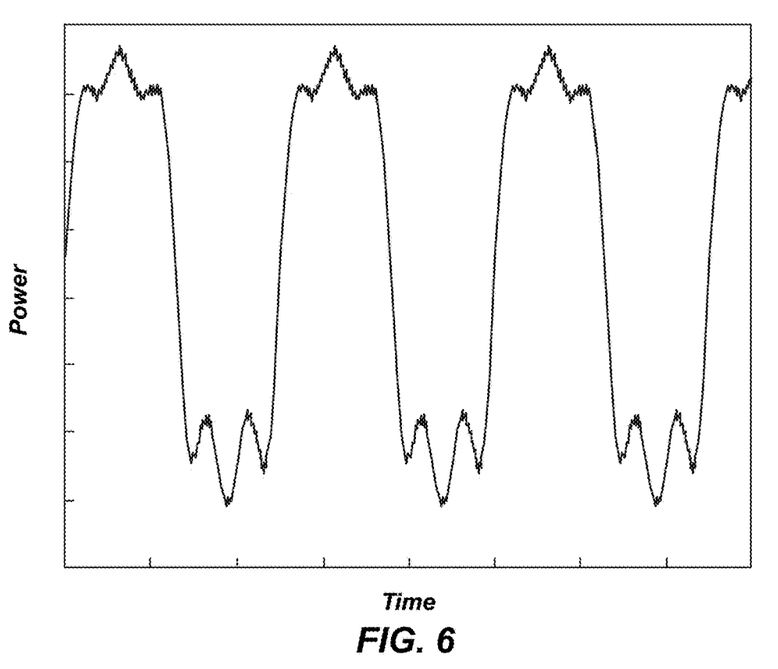
FIGS. 6 and 7 illustrate a square waveform and a flat-bottom waveform, respectively, applied during an etching process according to embodiments of the present disclosure.
Figure 7:
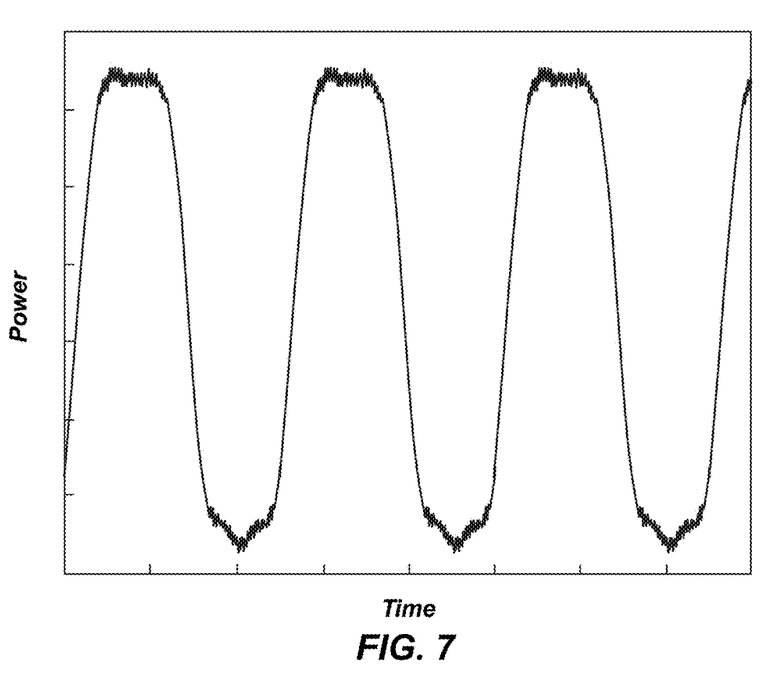

In some embodiments, the low frequency RF of the first, low frequency RF power source 124 has a non-sinusoidal waveform. As used herein, the term "non-sinusoidal" means and includes any waveform having a shape other than a sinusoidal waveform. FIGS. 6 and 7 illustrate exemplary non-sinusoidal waveforms of the low frequency RF power source 124. In some embodiments, the non-sinusoidal waveform may comprise a square waveform as illustrated in FIG. 6 or a flat-bottom waveform as illustrated in FIG. 7.

The non-sinusoidal low frequency waveform is formed by combining (e.g., superimposing) a plurality of sinusoidal waveforms having different frequencies and/or different amplitudes from each other. By way of example and not limitation, the non-sinusoidal waveform may be formed by combining waves having at least three different radio frequencies. In some embodiments, the non-sinusoidal waveform may be formed by combining a fundamental frequency and at least two harmonic frequencies of the fundamental frequency. In particular, the non-sinusoidal waveform may be formed by combining the fundamental frequency, the third harmonic, and the fifth harmonic to form the non-sinusoidal waveform. In some embodiments, the non-sinusoidal waveform may be formed by combining sine waves having a fundamental frequency, a third harmonic frequency, and a fifth harmonic frequency with frequencies of about 400 kHz, about 1.2 MHz, and about 2 MHz, respectively. Once formed, the combined frequencies may be applied by the low frequency RF power source 124 to the electrostatic chuck 106 during the etching process.

Further, the shape of the non-sinusoidal waveform may be selected by adjusting an amplitude of each sine wave of the non-sinusoidal waveform. In some embodiments, the sine wave having the fundamental frequency may have the greatest amplitude of the individual sine waves forming the non-sinusoidal waveform and the sine wave having the fifth harmonic frequency may have the lowest amplitude.

Figure 8:
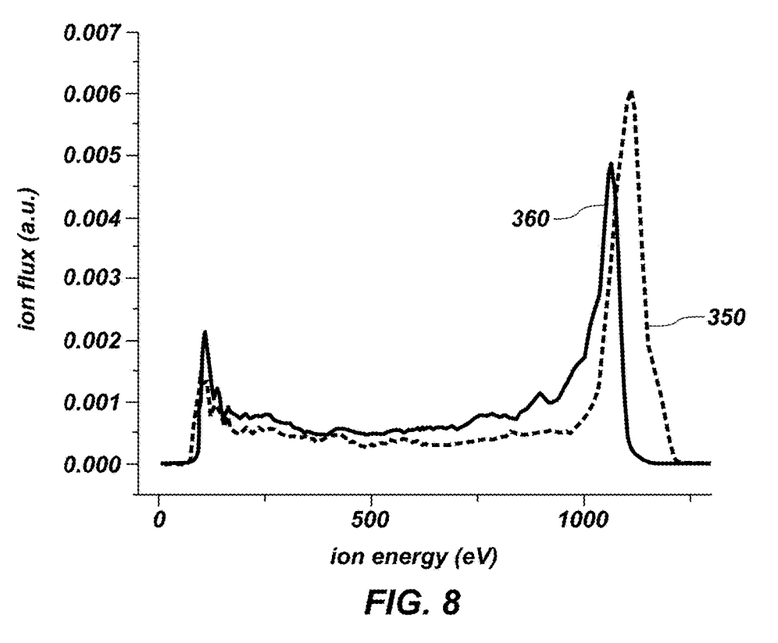
FIG. 8 is a graph illustrating an ion flux as a function of ion energy of a plasma generated during an etching process during which a square waveform or a sinusoidal waveform is applied according to embodiments of the present disclosure.

As a result of selectively forming the non-sinusoidal waveform and applying a low frequency RF power having the non-sinusoidal waveform to the electrostatic chuck 106 during the removal process, the etch rates of the materials of the semiconductor device structures may be at least 33% greater than etch rates of the same materials conducted at higher temperatures and applying low frequency, sinusoidal waveforms to the electrostatic chuck 106 during the removal process. Furthermore, as a result of applying a low frequency RF power having the non-sinusoidal waveform to the electrostatic chuck 106 during the removal process, the ion energy of the plasma used to etch the semiconductor device structure may be increased according to embodiments of the present disclosure. FIG. 8 compares the ion flux as a function of ion energy of a low frequency RF having a square waveform 350 as illustrated in FIG. 6 and a low frequency RF having a sinusoidal waveform 360. As illustrated in FIG. 8, the ion energy distribution of the square waveform 350 is concentrated at higher ion energies as compared to the sinusoidal waveform 360. Given that the etch rate of the semiconductor device structures 200, 300 materials is a product of the plasma ion energy and ion flux, increasing the ion energy of the plasma may effectively increase the etch rate. By increasing the etch rates, the productivity and throughput of forming the semiconductor device structures may be increased.

Figure 9:
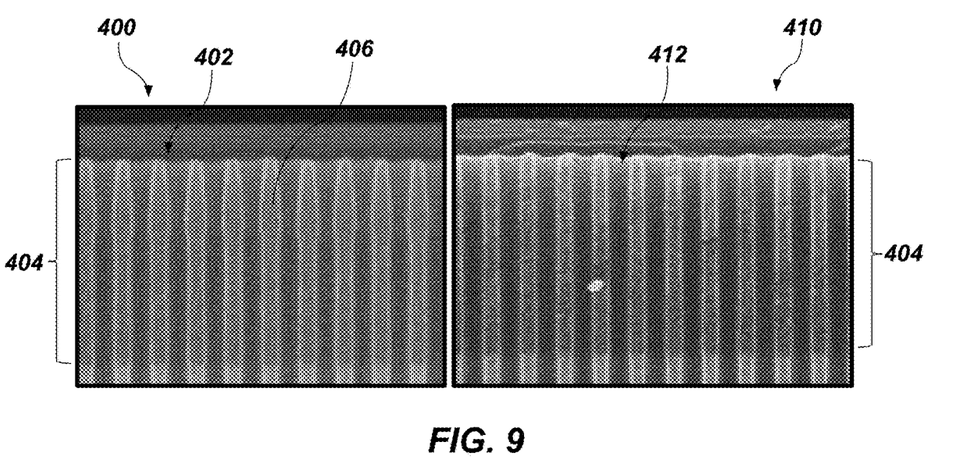
FIG. 9 is a comparative SEM image of a semiconductor device structure etched to form a hole using a sinusoidal waveform and a non-sinusoidal waveform, respectively.

FIG. 9 is a comparative illustration of a semiconductor device structure 400 that has been etched to form high aspect ratio (HAR) openings 402 using a sinusoidal low frequency, RF waveform and a semiconductor device structure 410 that has been etched to form HAR openings 412 using a non-sinusoidal low frequency RF waveform. Each semiconductor device structure 400, 410 includes the same materials and was etched using the same plasma gas composition and at room temperature (e.g., about 20° C.). During plasma etching with the sinusoidal waveform, the plasma etching gases may react with the etch mask material 404 and deposit material 406 on a sidewall of etch mask material 404, resulting in a phenomenon known as "necking." The deposited material 406 may inhibit plasma from etching holes as the deposited material 406 reduces the size of the opening within the etch mask material 404 through which the plasma passes to etch the tiered material of the semiconductor device structure 400 resulting in openings 402 of limited depth and increasing bowing. It is an advantage of the present disclosure that plasma etching during which a non-sinusoidal low frequency RF waveform is applied to the electrostatic chuck 106 does not result in substantial deposition of material (e.g., deposits) on the etch mask material 404. Accordingly, HAR openings 412 of greater depth and uniformity without substantial bowing may be formed.

Figure 10:
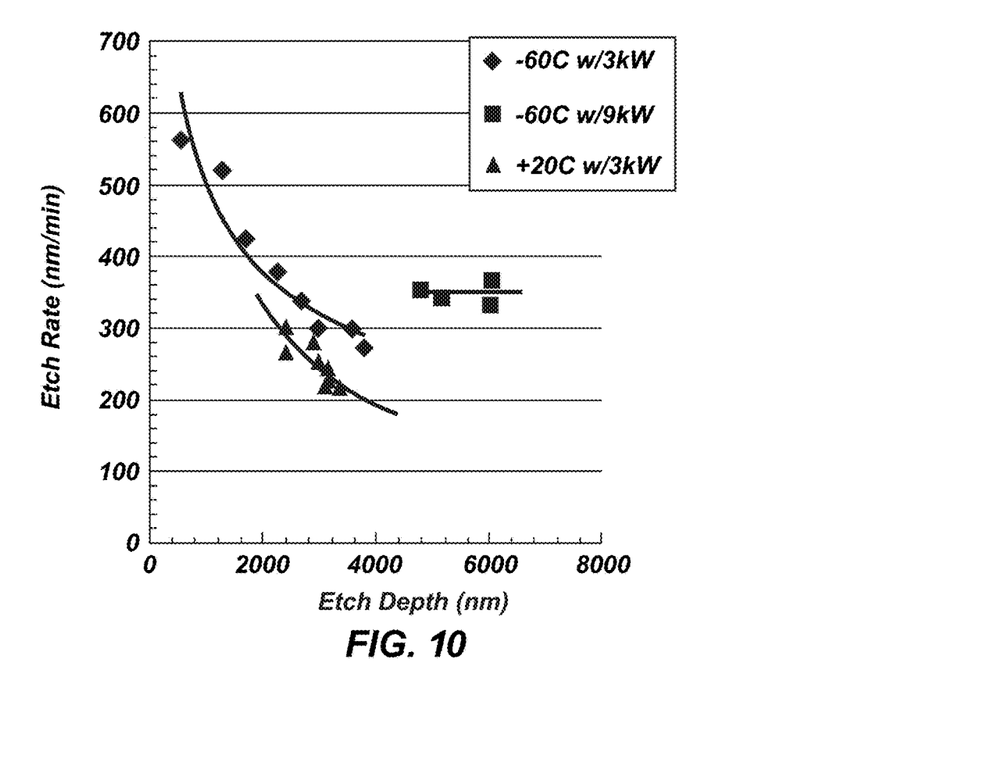
FIG. 10 is a graph comparing the experimentally obtained etch rates of a plasma etching process performed at room temperature using a plasma having an ion energy of 3 kW, a plasma etching process performed at −60° C. using a plasma having an ion energy of 3 kW, and a plasma etching process performed at −60° C. using a plasma having an ion energy of 9 kW as a function of etch depth.

Also according to embodiments of the present disclosure, application of the non-sinusoidal low frequency waveform to the electrostatic chuck 106 during the etching process and performing the etching process at low temperatures, such as temperatures less than or at about 0° C., less than or at about −30° C., or less than or at about −60° C., as previously described herein using the coolant system 140, may increase the etch rate of the semiconductor device structures 200, 300. In addition, application of the non-sinusoidal low frequency waveform to the electrostatic chuck 106 during the etching process and performing the etching process at low temperatures may increase the etch depth, or depth to which HAR openings 201, 301 may be formed in the semiconductor device structures 200, 300. FIG. 10 compares the experimentally obtained etch rate of a plasma etching process performed at 20° C. using a plasma having an ion energy of 3 kW, a plasma etching process performed at −60° C. using a plasma having an ion energy of 3 kW, and a plasma etching process performed at −60° C. using a plasma having an ion energy of 9 kW as a function of etch depth. The etching process was completed using the a gas combination of hydrogen ($H_2$), nitrogen trifluoride ($NF_3$), trifluoroiodomethane ($CF_3I$), difluoromethane ($CH_2F_2$), and fluoromethane ($CH_3F$), and a waveforms having a RF of 60 MHz and 400 KHz. As illustrated in FIG. 10, decreasing the temperature of the electrostatic chuck 106 from 20° C. to −60° C. and maintaining the ion energy of the plasma resulted in an increased etch rate without increasing the etch depth. As further illustrated in FIG. 10, decreasing the temperature from 20° C. to −60° C. and increasing the ion energy of the plasma resulted in an increase in etch rate as compared to the room temperature plasma etching process and an increase in the etch depth over either comparatively low energy plasma etching processes performed at 20° C. and −60° C. As previously discussed and illustrated with regard to FIG. 8, the ion energy of the plasma may be increased by applying a non-sinusoidal, low frequency RF waveform to the electrostatic chuck 106. Accordingly, the combined effect of lowering temperature and increasing ion energy of the plasma by, for example, forming the low RF power source to have a non-sinusoidal waveform applied during the plasma etching process is an increased etch rate of the materials of the semiconductor device structures and increased etch depth as compared to decreasing the temperature of the electrostatic chuck to, for example, −60° C. alone. By increasing the etch rates and the etch depth, the productivity of forming the semiconductor device structures and the aspect ratio of the opening formed in the semiconductor device structures may be increased.

The following examples serve to explain embodiments of the disclosure in more detail. The examples as not to be construed as being exhaustive or exclusive as to the scope of the disclosure.

EXAMPLES

Example 1

Figure 11:
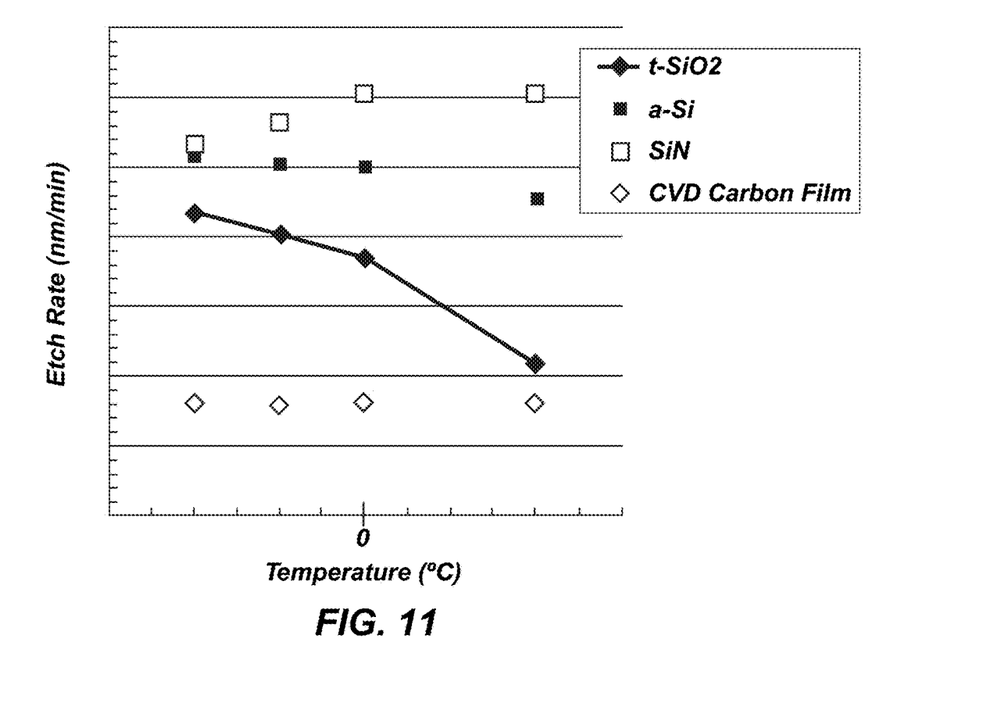
FIG. 11 is a graph illustrating the etch rates for materials of the semiconductor devices of FIGS. 2 and 3 using a three gas plasma composition according to embodiments of the present disclosure.

The effect of plasma etching on silicon dioxide, amorphous silicon, silicon nitride and a chemical vapor deposition (CVD) carbon film, such as an ashable hard mask material, with a three gas combination as a function of decreasing temperatures was analyzed. Blanket films of silicon dioxide, amorphous silicon, silicon nitride, and CVD carbon film were etched using a plasma comprising difluoromethane ($CH_2F_2$), hydrogen ($H_2$), and nitrogen trifluoride ($NF_3$). The plasma comprised two parts hydrogen ($H_2$) and four parts nitrogen trifluoride ($NF_3$) for every one part difluoromethane ($CH_2F_2$). The etching process was completed using the aforementioned gas combination at multiple, different electrostatic chuck 106 temperatures above and below 0° C. The temperature was controlled by the coolant system 140 during the etching process. As illustrated in FIG. 11, the etch rate of silicon oxide increased with decreasing electrostatic chuck 106 temperatures, while etch rates of amorphous silicon, silicon nitride, and CVD carbon film remained substantially unchanged. Accordingly, etch rates of semiconductor devices comprising oxide materials may be effectively increased by lowering the temperatures at which the plasma etching process is performed and by including a hydrogen-based gas in the plasma.

Example 2

Figure 12:
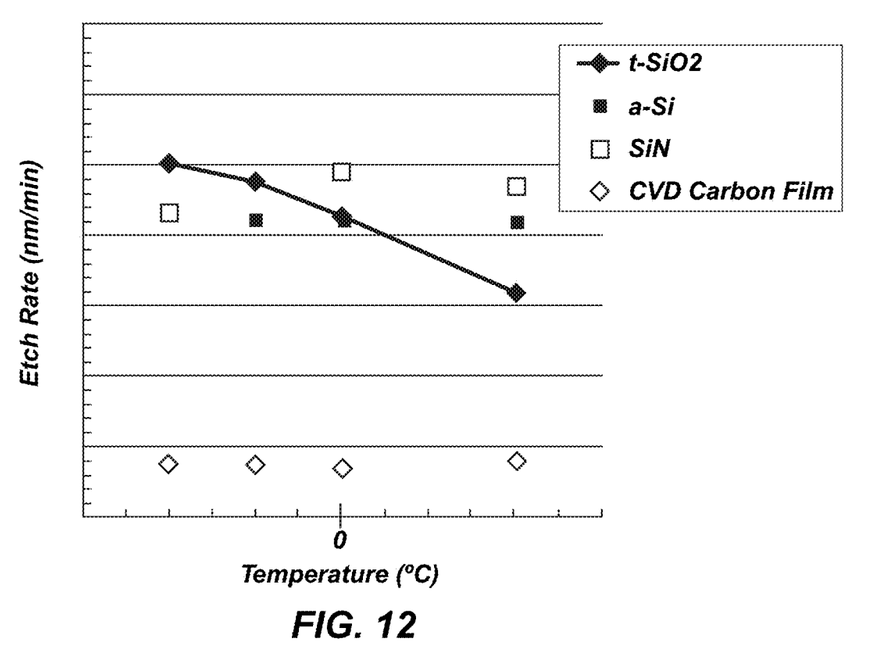
FIG. 12 is a graph illustrating etch rates for materials of the semiconductor devices of FIGS. 2 and 3 using another three gas plasma composition according to embodiments of the present disclosure.

The effect of plasma etching on silicon dioxide, amorphous silicon, silicon nitride and CVD carbon film with a three gas combination as a function of decreasing temperatures was analyzed. Blanket films of silicon dioxide, amorphous silicon, silicon nitride, and CVD carbon film were etched using a plasma comprising methane ($CH_4$), hydrogen ($H_2$), and nitrogen trifluoride ($NF_3$). In particular, the plasma comprised two parts hydrogen ($H_2$) and four parts nitrogen trifluoride ($NF_3$) for every one part difluoromethane ($CH_2F_2$). As illustrated in FIG. 12, the etch rate of silicon oxide increased with decreasing electrostatic chuck 106 temperatures, while etch rates of amorphous silicon, silicon nitride, and CVD carbon film remained substantially unchanged.

Example 3

Figure 13:
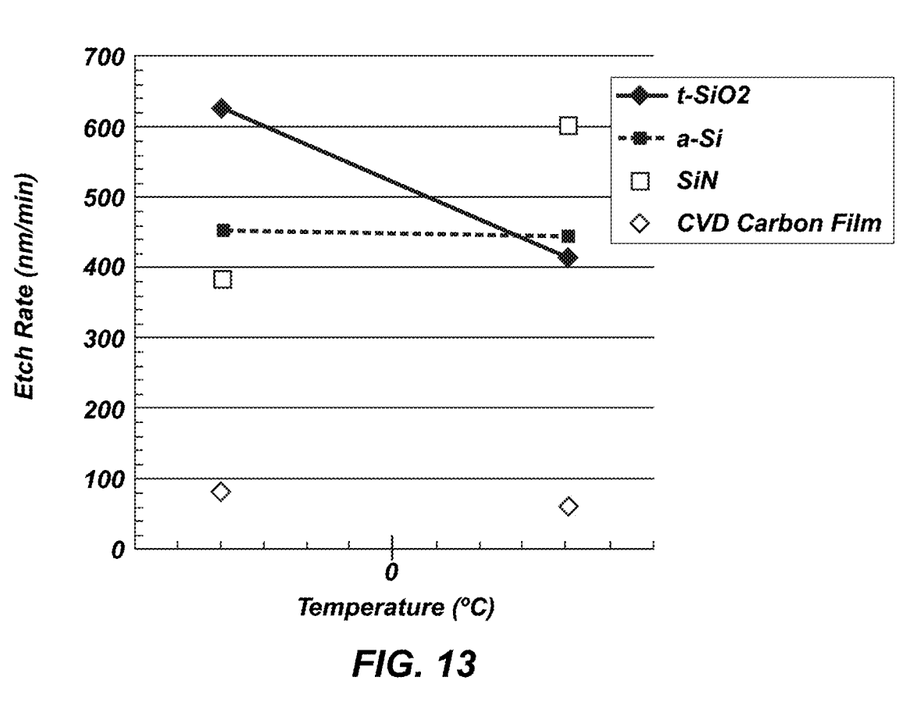
FIG. 13 is a graph illustrating the etch rates for materials of the semiconductor devices of FIGS. 2 and 3 using an eight gas plasma composition according to embodiments of the present disclosure.

The effect of plasma etching on silicon dioxide, amorphous silicon, silicon nitride and CVD carbon film with an eight gas combination as a function of decreasing temperatures was analyzed. Blanket films of silicon dioxide, amorphous silicon, silicon nitride, and CVD carbon film were etched using a plasma comprising equal parts carbonyl sulfide (COS), hydrogen bromide (HBr), methane ($CH_4$), octafluorocyclobutane ($C_4F_8$), fluoromethane ($CH_3F$), hydrogen ($H_2$), nitrogen trifluoride ($NF_3$), and trifluoroiodomethane ($CF_3I$). As illustrated in FIG. 13, the etch rate of silicon oxide increased with decreasing electrostatic chuck 106 temperatures, while etch rates of amorphous silicon, silicon nitride, and CVD carbon film remained substantially unchanged.

In view of the etch results of FIGS. 11-13, etch rates of semiconductor devices comprising oxide materials such as silicon oxide may be effectively increased by lowering the temperatures at which the plasma etching process is performed and by including a hydrogen-based gas in the plasma.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of processing a semiconductor device structure, comprising:
    generating a plasma of a gas comprising a hydrogen-based gas and a fluorine-based gas, the hydrogen-based gas comprising between about 40 percent by volume (vol %) and about 75 vol % of the gas, the hydrogen-based gas comprising hydrogen ($H_2$);
    cooling an electrostatic chuck on which a semiconductor device structure is positioned to a temperature of about −30° C. or less, the semiconductor device structure comprising tiers of alternating materials including at least one dielectric material;
    applying a low frequency radio frequency having a non-sinusoidal waveform to the electrostatic chuck; and
    with the plasma and while cooling the electrostatic chuck and applying the low frequency radio frequency, forming a high aspect ratio opening in the semiconductor device structures;
    wherein the high aspect ratio is at least about 50:1.

2. The method of claim 1, wherein generating a plasma of a gas comprises generating a plasma of a gas comprising about 50 vol % hydrogen-based gas.

3. The method of claim 1, wherein generating a plasma of a gas comprises generating a plasma of a gas comprising difluoromethane ($CH_2F_2$), the hydrogen ($H_2$), and nitrogen trifluoride ($NF_3$).

4. The method of claim 1, wherein generating a plasma of a gas comprises generating a plasma of a gas comprising methane ($CH_4$), the hydrogen ($H_2$), and nitrogen trifluoride ($NF_3$).

5. The method of claim 1, wherein generating a plasma of a gas comprises generating a plasma of a gas comprising the hydrogen ($H_2$) and carbon tetrafluoride ($CF_4$).

6. The method of claim 1, wherein generating a plasma of a gas comprises generating a plasma of a gas comprising carbonyl sulfide (COS), hydrogen bromide (HBr), methane ($CH_4$), octafluorocyclobutane ($C_4F_8$), fluoromethane ($CH_3F$), the hydrogen ($H_2$), nitrogen trifluoride ($NF_3$), and trifluoroiodomethane ($CF_3I$).

7. The method of claim 1, wherein cooling an electrostatic chuck comprises cooling the electrostatic chuck to a temperature of about −60° C. or less.

8. The method of claim 1, wherein the semiconductor device structure comprises alternating tiers of the at least one dielectric material and another dielectric material.

9. The method of claim 1, wherein the semiconductor device structure comprises alternating tiers of the at least one dielectric material and a conductive material.

10. The method of claim 1, wherein the at least one dielectric material comprises a silicon oxide.

11. A method of processing a semiconductor device structure, comprising:
    generating a plasma of a gas comprising a hydrogen-based gas in a range from about 40 vol % to about 90 vol % of the plasma, the hydrogen-based gas comprising hydrogen ($H_2$);
    cooling an electrostatic chuck on which a semiconductor device structure is positioned to a temperature of about −30° C. or less, the semiconductor device structure comprising tiers of alternating materials including at least one dielectric material;
    applying a low frequency radio frequency having a non-sinusoidal waveform to the electrostatic chuck; and
    with the plasma and while cooling the electrostatic chuck and applying the low frequency radio frequency, forming a high aspect ratio opening in the semiconductor device structure;
    wherein the high aspect ratio is at least about 50:1.

12. The method of claim 11, further comprising combining a plurality of sinusoidal waveforms to generate the low frequency radio frequency having the non-sinusoidal waveform.

13. The method of claim 12, wherein combining a plurality of sinusoidal waveforms to generate the low frequency radio frequency comprises combining a fundamental frequency and at least two harmonic frequencies of the fundamental frequency.

14. The method of claim 12, wherein combining a plurality of sinusoidal waveforms to generate the low frequency radio frequency comprises combining at least a fundamental frequency, a third harmonic frequency of the fundamental frequency, and a fifth harmonic frequency of the fundamental frequency.

15. The method of claim 11, wherein applying a low frequency radio frequency to the electrostatic chuck comprises applying a radio frequency having a frequency between about 100 Hz and about 3.2 MHz or less.

16. The method of claim 11, wherein generating a plasma of a gas comprises generating a plasma of a gas comprising difluoromethane ($CH_2F_2$), the hydrogen ($H_2$), and nitrogen trifluoride ($NF_3$) into a reaction chamber.

17. The method of claim 11, wherein generating a plasma of a gas comprises generating a plasma of a gas comprising the hydrogen ($H_2$) and carbon tetrafluoride ($CF_4$).

18. The method of claim 11, wherein generating a plasma of a gas comprises generating a plasma of a gas comprising carbonyl sulfide (COS), hydrogen bromide (HBr), methane ($CH_4$), octafluorocyclobutane (ClF's), fluoromethane ($CH_3F$), the hydrogen ($H_2$), nitrogen trifluoride ($NF_3$), and trifluoroiodomethane ($CF_3I$).

19. The method of claim 11, wherein cooling an electrostatic chuck comprises cooling the electrostatic chuck to a temperature of about −60° C. or less.

20. A system for processing a semiconductor device structure, comprising:

a chamber;

an electrode in the chamber;

at least a DC power source operably coupled to the electrode;

an electrostatic chuck located in the chamber below the electrode and configured to receive a semiconductor device structure thereon;

a coolant system operably coupled to the electrostatic chuck and configured to reduce the electrostatic chuck to a temperature of about −30° C. or less; and at least one low frequency radio frequency (RF) power source coupled to the electrostatic chuck, the low frequency RF power source configured to generate a frequency of between about 100 Hz and about 3.2 MHz exhibiting a non-sinusoidal waveform comprising a combination of a plurality of sinusoidal waveforms for application to the electrostatic chuck to form a high aspect ratio opening of at least about 50:1 in the semiconductor device structure received on the electrostatic chuck.

21. The system of claim 20, wherein the at least one low frequency RF power source is configured to generate a frequency having a non-sinusoidal waveform by combining a fundamental frequency with at least two harmonic frequencies of the fundamental frequency.

22. The system of claim 21, wherein the at least two harmonic frequencies of the fundamental frequency comprise a third harmonic frequency and a fifth harmonic frequency of the fundamental frequency.

23. The system of claim 20, wherein the at least one low frequency RF power source is configured to generate a non-sinusoidal waveform having one of a square waveform shape and a flat-bottom waveform shape.

24. The system of claim 20, wherein one of the electrode and the electrostatic chuck is operably coupled to a high frequency RF power source configured to generate a frequency of about 13 MHz to about 60 MHz.

* * * * *

UNITED STATES PATENT AND TRADEMARK OFFICE
CERTIFICATE OF CORRECTION

PATENT NO. : 10,811,267 B2
APPLICATION NO. : 15/851178
DATED : October 20, 2020
INVENTOR(S) : Ken Tokashiki It is certified that error appears in the above-identified patent and that said Letters Patent is hereby corrected as shown below:

In the Claims

| | | | |
|---|---|---|---|
| Claim 1, | Column 11, | Line 49, | change "device structures;" to --device structure;-- |
| Claim 18, | Column 12, | Line 62, | change "(CIF's), fluoromethane" to --($C_4F_8$), flouromethane-- |

Signed and Sealed this
Twenty-second Day of December, 2020

Andrei Iancu
*Director of the United States Patent and Trademark Office*